United States Patent
Lin

(10) Patent No.: US 7,583,503 B2
(45) Date of Patent: Sep. 1, 2009

(54) THERMAL MODULE ALLOWING ADJUSTMENT IN THE HEIGHT OF HEAT SINK RELATIVE TO FIXING RACK

(75) Inventor: Sheng-Huang Lin, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 0 days.

(21) Appl. No.: 12/045,158

(22) Filed: Mar. 10, 2008

(65) Prior Publication Data

US 2009/0129023 A1 May 21, 2009

(30) Foreign Application Priority Data

Nov. 20, 2007 (TW) ............................ 96219609 U

(51) Int. Cl.
*H05K 7/20* (2006.01)
(52) U.S. Cl. ................... 361/704; 361/709; 361/719; 165/80.3; 174/16.3; 257/718
(58) Field of Classification Search ......... 361/702–712, 361/715, 717–724; 165/80.2, 80.3, 80.4, 165/104.33, 185; 174/15.1, 16.3, 252; 257/706–727; 29/830, 832, 837; D13/179
See application file for complete search history.

(56) References Cited

U.S. PATENT DOCUMENTS

| | | | |
|---|---|---|---|
| 5,579,827 A * | 12/1996 | Chung | 165/80.3 |
| D477,291 S * | 7/2003 | Lee | D13/179 |
| D478,875 S * | 8/2003 | Lee | D13/179 |
| 6,712,127 B2 * | 3/2004 | Lee | 165/80.3 |
| 6,782,941 B2 * | 8/2004 | Lee | 165/80.3 |
| 6,947,284 B2 | 9/2005 | Liu | |
| 7,193,853 B2 | 3/2007 | Chen et al. | |
| 7,262,969 B2 | 8/2007 | Lee et al. | |
| D561,123 S * | 2/2008 | Mochizuki et al. | D13/179 |
| D564,460 S * | 3/2008 | Otsuki et al. | D13/179 |
| 7,423,880 B1 * | 9/2008 | Tang | 361/709 |
| 7,495,921 B2 * | 2/2009 | Chang et al. | 361/719 |

* cited by examiner

Primary Examiner—Michael V Datskovskiy

(57) ABSTRACT

A thermal module includes a fixing rack and a heat sink fitted in the fixing rack. The fixing rack is provided at an inner side with a plurality of stoppers and a plurality of projected portions located adjacent to the stoppers with a height difference existed between them. The heat sink is provided along an outer periphery with a plurality of vertically extended grooves. The heat sink may be selectively fitted in the fixing rack with the grooves corresponding to or not corresponding to the projected portions on the fixing rack, so that an upper surface of the heat sink may be upward abutted on the upper stoppers or the projected portions, respectively, to restrict the fixing rack from sliding downward. Meanwhile, due to the height difference between the stoppers and the projected portions, a distance between the upper surface of the heat sink and the fixing rack is adjustable.

6 Claims, 6 Drawing Sheets

THERMAL MODULE ALLOWING ADJUSTMENT IN THE HEIGHT OF HEAT SINK RELATIVE TO FIXING RACK

FIELD OF THE INVENTION

The present invention relates to a thermal module for radiating heat produced by an electronic device during the operation thereof, and more particularly to a thermal module allowing adjustment in the height of heat sink relative to fixing rack.

BACKGROUND OF THE INVENTION

Various kinds of electronic information products, such as computers, are very popular among people now, and provide a wide range of applications. Due to the increasing growth of market demands, electronic information industrial technologies are quickly developed to provide increased data processing and accessing speed. However, a large amount of heat is also produced during the high-speed operation of the parts in the electronic information products.

Taking a computer as an example, the central processing unit (CPU) produces more heat than other parts in the computer. When the produced heat increases, the CPU tends to have gradually decreased working efficiency. And, when the produced heat accumulates to exceed an allowable limit, the computer is subject to the risk of becoming down or even damaged. Moreover, to solve the problem of electromagnetic radiation, all the parts of the computer are enclosed in a case. Therefore, it is important to quickly dissipate the heat produced by the operating CPU and other heat-producing parts or elements in the electronic information products.

Generally, a heat sink is disposed atop the CPU to obtain the purpose of heat dissipation. The heat sink is provided at one side with a plurality of radiating fins, and is disposed on the CPU with another side without the radiating fins in direct contact with the CPU, so that heat produced by the CPU is transferred to and radiated from the radiating fins of the heat sink. A cooling fan may be optionally provided to produce airflow for carrying away the produced heat more quickly.

FIG. 1 is an assembled perspective view of a conventional thermal module 1. As shown, the thermal module 1 includes a fixing rack 11 and a plurality of radiating fins 12. The fixing rack 11 is a framework having a radially inward extended covering flange 112 formed at a top thereof, so that the fixing rack 11 may cover the radiating fins 12 with an upper side 121 of the radiating fins 12 upward abutted on the covering flanges 112. The fixing rack 11 is then connected to the motherboard of the computer. With the fixing rack 11 of the conventional thermal module 1, the plurality of radiating fins 12 can be fitted in the fixing rack 11 only at a fixed height relative to the top of the fixing rack 11. That is, it is impossible to properly adjust the distance between the upper side 121 of the radiating fins 12 and the covering flanges 112 of the fixing rack 1 according to actual need. Therefore, the conventional thermal module 1 provides relatively low applicability. Sometimes, to meet different heat dissipation requirements, a user has to purchase different fixing racks 11 for using with the radiating fins 12. Therefore, the conventional fixing rack 11 is not economical for use and requires improvement.

SUMMARY OF THE INVENTION

A primary object of the present invention is to provide a thermal module that allows adjustment in the height of the heat sink relative to the fixing rack.

To achieve the above and other objects, the thermal module according to the present invention includes a fixing rack and a heat sink fitted in the fixing rack. The fixing rack is provided at an inner side with a plurality of stoppers and projected portions for restricting the fixing rack from sliding downward relative to the heat sink. The heat sink is provided along an outer periphery at predetermined positions with a plurality of vertically extended grooves. With the heat sink upward abutted on the stoppers or the projected portions, the fixing rack is restricted from sliding downward. And, due to a height difference between the stoppers and the projected portions, the distance between an upper surface of the heat sink and an upper end surface of the fixing rack may be changed. Therefore, the fixing rack of the thermal module of the present invention provides good applicability and is more economical for use.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
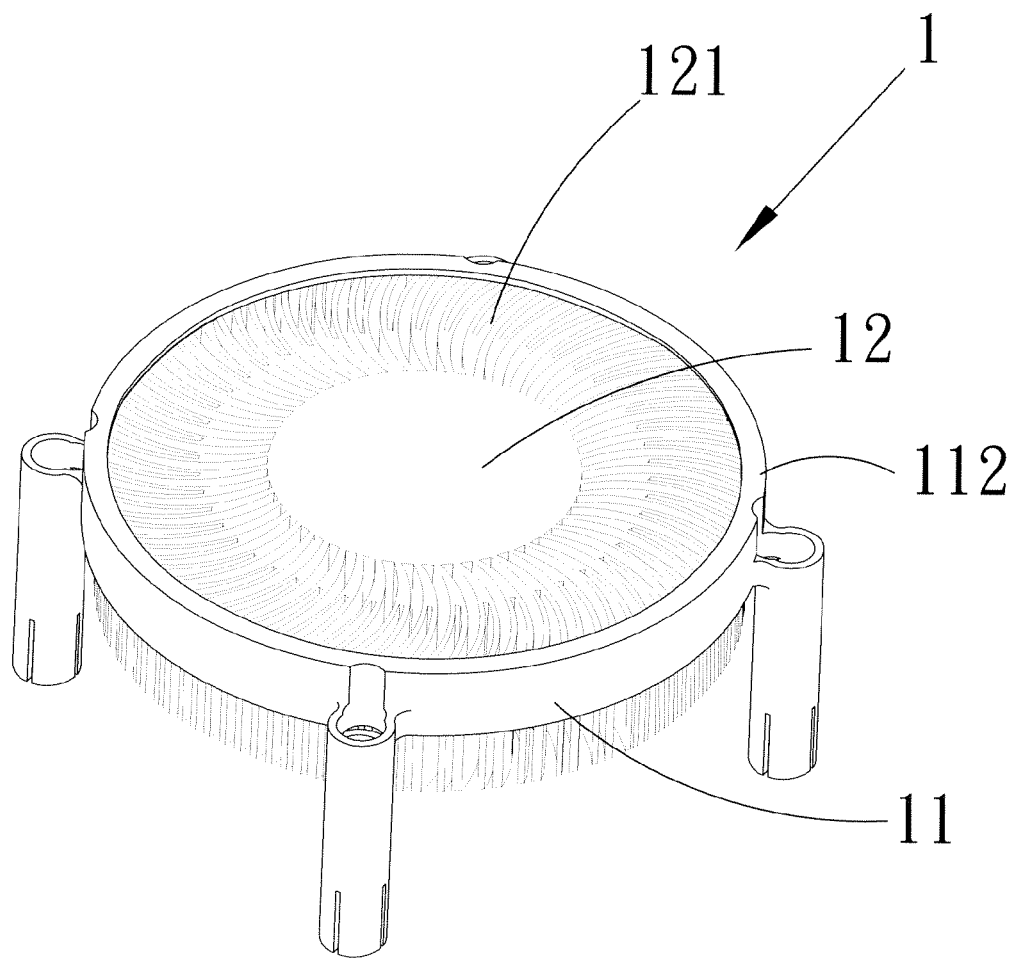
FIG. 1 is an assembled perspective view of a conventional thermal module.
Figure 2:
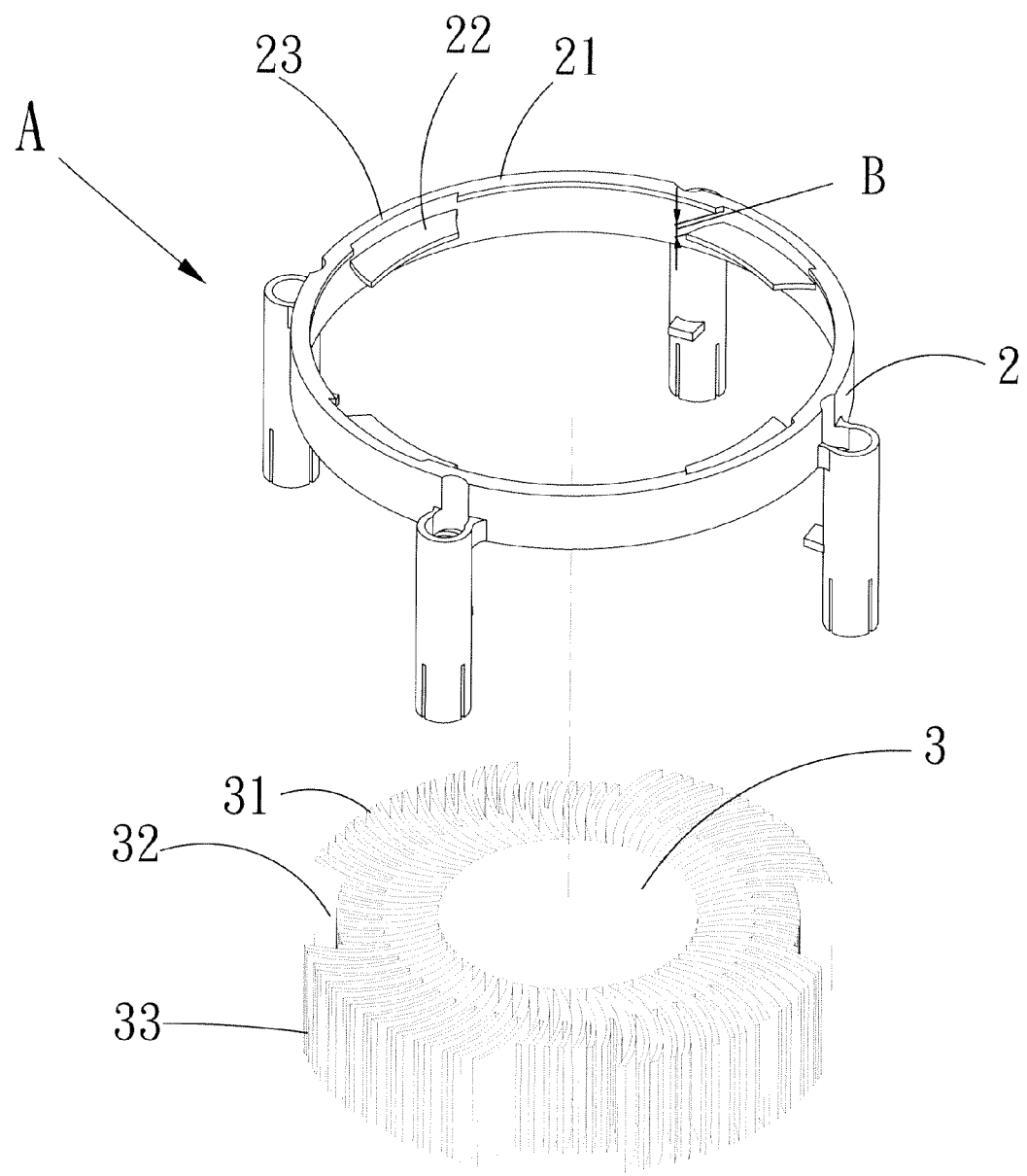
FIG. 2 is an exploded perspective view of a thermal module having a fixing rack and a heat sink according to a preferred embodiment of the present invention.
Figure 4:
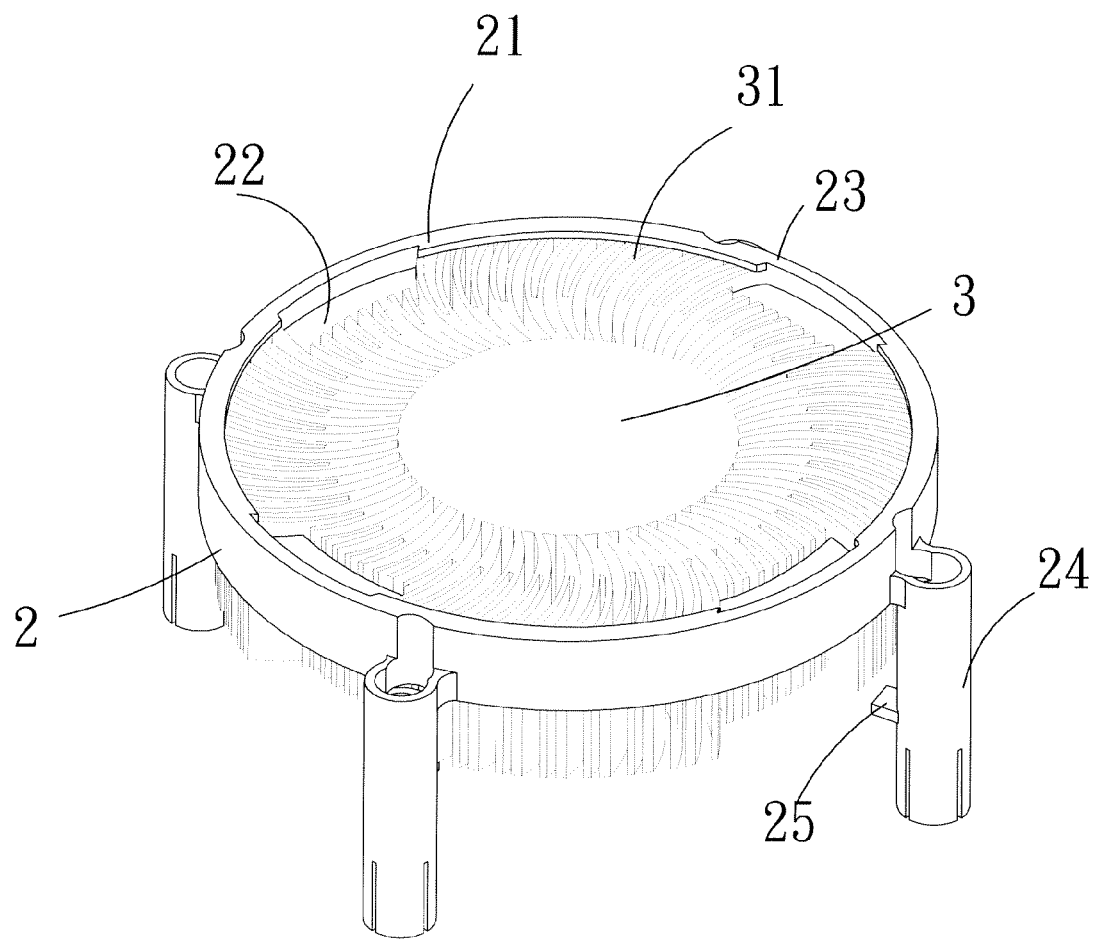
FIG. 4 is an assembled perspective view of the thermal module of the present invention.

Please refer to FIGS. 2 and 4 that are exploded and assembled perspective views, respectively, of a thermal module A according to a preferred embodiment of the present invention. As shown, the thermal module A includes a fixing rack 2 and a heat sink 3.

The fixing rack 2 is an annular framework with a plurality of supporting legs 24 spaced along an outer periphery thereof. The supporting legs 24 are each internally provided with a spring-loaded locating element (not shown) for the fixing rack 2 to hold the heat sink 3 to a motherboard of an electronic device. The fixing rack 2 is provided at an inner side of the annular framework with a plurality of spaced and radially inward extended stoppers 21 and a plurality of spaced and radially inward extended projected portions 22. The stoppers 21 may be flash with or slightly lower than an upper end surface 23 of the fixing rack 2. The projected portions 22 are separately located adjacent to and lower than the stoppers 21, such that the projected portions 22 are parallel to and horizontally offset from the stopper 21 with a height difference B existed between the stoppers 21 and the projected portions 22.

The heat sink 3 has a round configuration having an outer diameter slightly smaller than an inner diameter of the fixing rack 2 for fitting in the fixing rack 2, and is provided on an outer periphery 33 thereof at predetermined positions with a plurality of vertically extended grooves 32. The vertical grooves 32 have a cross sectional shape similar to that of the projected portions 22 on the fixing rack 2, and a width slightly larger than that of the projected portions 22 for the latter to separately slide into the vertical grooves 32. When the projected portions 22 on the fixing rack 2 are slid into and engaged with the vertical grooves 32 on the heat sink 3, the heat sink 3 may be fitted in the fixing rack 2 with an upper surface 31 of the heat sink 3 upward abutted on the stoppers 21 of the fixing rack 2, so that the fixing rack 2 is supported above the heat sink 3 with only a small distance existed between the upper surface 31 of the heat sink 3 and the upper end surface 23 of the fixing rack 2, as shown in FIGS. 4 and 6.

Figure 3:
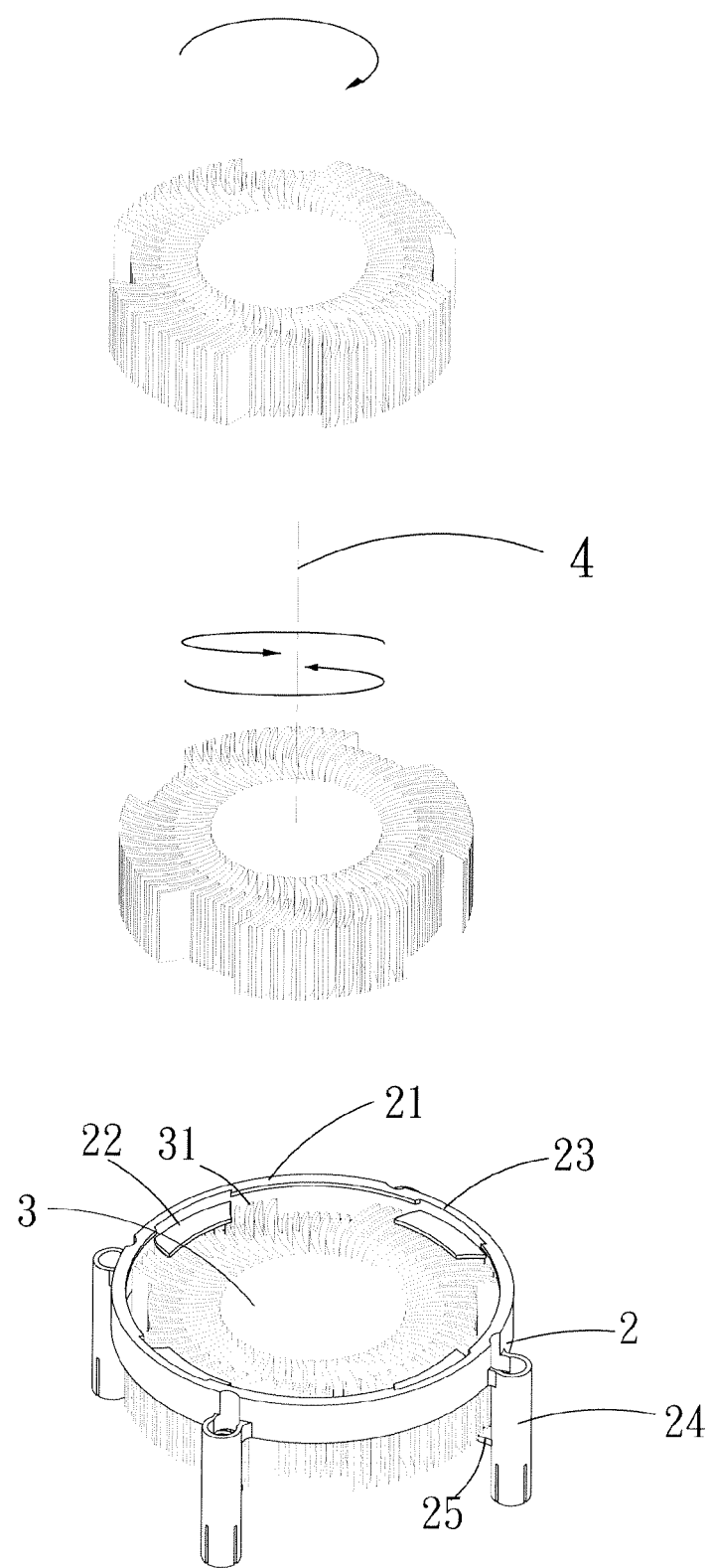
FIG. 3 shows the manner of horizontally turning the heat sink of the thermal module of the present invention.
Figure 5:
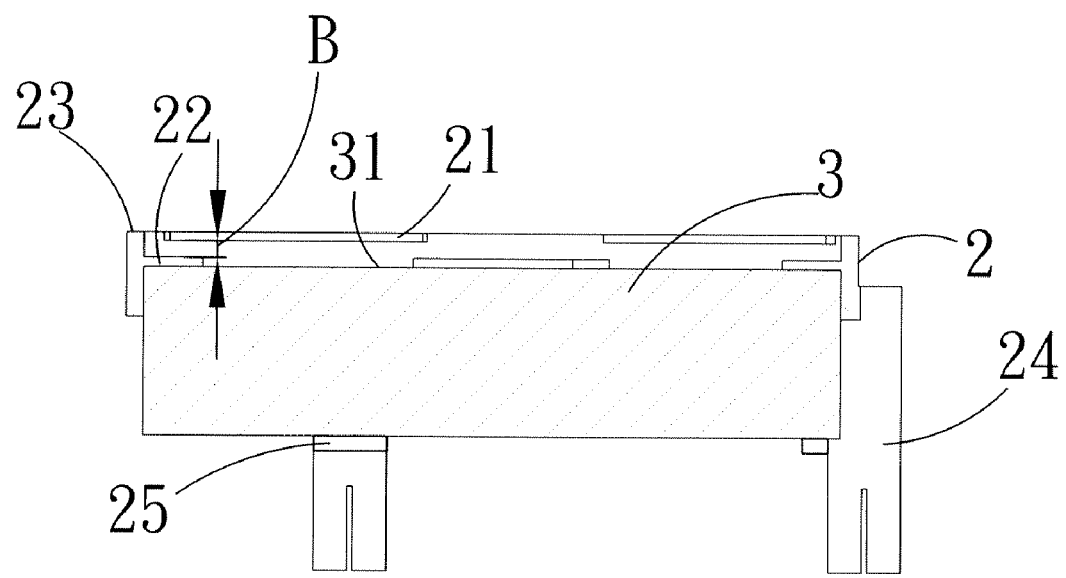
FIG. 5 is a sectioned side view of the thermal module of the present invention with an upper surface of the heat sink upward abutted on a plurality of projected portions on the fixing rack.

Alternatively, the heat sink 3 may be fitted in the fixing rack 2 with an increased distance existed between the upper surface 31 of the heat sink 3 and the upper end surface 23 of the fixing rack 2. To do so, simply horizontally turn the heat sink 3 about an imaginary axis 4 thereof clockwise or counterclockwise by a predetermined angle, as shown in FIG. 3, so that the vertical grooves 32 of the heat sink 3 fitted in the fixing rack 2 are located at positions offset from the projected portions 22 on the fixing rack 2. When the heat sink 3 is fitted in the fixing rack 2 with the vertical grooves 32 horizontally offset from the projected portions 22, the upper surface 31 of the heat sink 3 is upward abutted on the projected portions 22 to form an increased distance B between the upper surface 31 of the heat sink 3 and the upper end surface 23 of the fixing rack 2, as shown in FIGS. 3 and 5. Therefore, with the vertical grooves 32 provided on the heat sink 3 and the stoppers 21 and the projected portions 22 provided in the fixing rack 2, the heat sink 3 may be fitted in the fixing rack 2 at different heights relative to the upper end surface 23 of the fixing rack 2, and the problem of not able to adjust the distance between the heat sink 3 and the fixing rack 2 as in the conventional thermal module may be solved.

As can be clearly seen from FIG. 5, the heat sink 3 is fitted in the fixing rack 2 with the supper surface 31 of the heat sink 3 upward abutted on the projected portions 22 on the fixing rack 2, so that the fixing rack 2 is supported above the heat sink 3.

Figure 6:
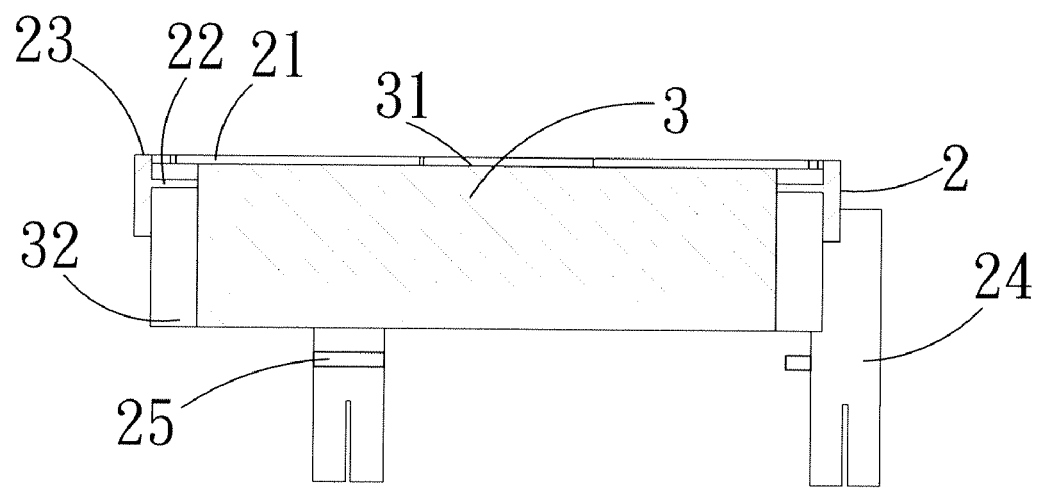
FIG. 6 another sectioned side view of the thermal module of the present invention with an upper surface of the heat sink upward abutted on a plurality of stoppers on the fixing rack.

And, as can be clearly seen from FIG. 6, the heat sink 3 is fitted in the fixing rack 2 with the supper surface 31 of the heat sink 3 upward abutted on the stoppers 21 on the fixing rack 2, so that the fixing rack 2 is supported above the heat sink 3 and restricted from sliding downward relative to the heat sink 3.

In brief, the thermal module A of the present invention is provided on the fixing rack 1 with stoppers 21 and projected portions 22 that are vertically offset from each other by a predetermined distance, and the heat sink 3 may be selectively fitted in the fixing rack 2 to abut an upper surface 31 on the higher stoppers 21 or the lower projected portions 22, so that a distance between the heat sink 3 and a cooling fan is adjustable according to actual need.

Moreover, the fixing rack 2 is provided on the supporting legs 24 with an inward projected holding portion 25 each for supporting the heat sink 3 thereon when the heat sink 3 is fitted in the fixing rack 2, so that the heat sink 3 is prevented from falling.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A thermal module comprising:
    a fixing rack being provided at an inner side with a plurality of stoppers and a plurality of projected portions located adjacent to and lower than the stoppers, so that the projected portions are horizontally offset from the stoppers with a height difference existed between them; and
    a heat sink being fitted in the fixing rack and provided along an outer periphery with a plurality of vertically extended grooves;
    wherein when the heat sink is fitted in the fixing rack with the vertical grooves located at positions corresponding to the projected portions on the fixing rack, the projected portions may separately slide into and engage with the vertical grooves for an upper surface of the heat sink to upward abut on the higher stoppers of the fixing rack; and, when the heat sink is fitted in the fixing rack with the vertical grooves horizontally offset from the projected portions on the fixing rack, the upper surface of the heat sink is upward abutted on the lower projected portions to increase a distance existed between the upper surface of the heat sink and the fixing rack due to the height difference between the stoppers and the projected portions.

2. The thermal module as claimed in claim 1, wherein the vertical grooves provided on the heat sink have a width slightly larger than that of the projected portions.

3. The thermal module as claimed in claim 1, wherein the heat sink has a round configuration.

4. The thermal module as claimed in claim 3, wherein the fixing rack is an annular framework.

5. The thermal module as claimed in claim 4, wherein the fixing rack has an inner diameter slightly larger than an outer diameter of the heat sink.

6. The thermal module as claimed in claim 1, wherein the fixing rack is provided with a plurality of supporting legs, and each of the supporting legs is provided with a holding portion, on which the heat sink is supported and thereby protected from falling.

* * * * *